United States Patent
Choi

(10) Patent No.: US 6,437,296 B1
(45) Date of Patent: Aug. 20, 2002

(54) ALIGNMENT APPARATUS OF THE SUBSTRATE FOR LCD

(75) Inventor: Hyun-Kue Choi, Kyoungsangbuk-do (KR)

(73) Assignee: LG. Philips LCD Co. Ltd., Seoul (KR)

( * ) Notice: Subject to any disclaimer, the term of this patent is extended or adjusted under 35 U.S.C. 154(b) by 0 days.

(21) Appl. No.: 09/740,832

(22) Filed: Dec. 21, 2000

(51) Int. Cl.[7] .............................. H05B 3/68; C23C 16/00
(52) U.S. Cl. .................................... 219/444.1; 118/725
(58) Field of Search ........................ 219/444.1, 461.1; 118/724, 725, 727, 728, 729, 730, 500

(56) References Cited

U.S. PATENT DOCUMENTS

| | | | | |
|---|---|---|---|---|
| 4,518,848 A | * | 5/1985 | Weber | 219/444.1 |
| 5,854,468 A | * | 12/1998 | Muka | 219/544.1 |
| 6,051,815 A | * | 4/2000 | Satou | 118/728 |
| 6,087,632 A | * | 7/2000 | Mizosaki et al. | 118/725 |
| 6,315,878 B1 | * | 11/2001 | Patadia et al. | 118/500 |

* cited by examiner

Primary Examiner—Sang Paik
(74) Attorney, Agent, or Firm—Birch, Stewart, Kolasch & Birch, LLP

(57) ABSTRACT

The present invention discloses an alignment apparatus, including: a table; a plurality of guide pins positioned on a peripheral protion of the table; a determined area defined by the guide pins in the table; a plurality of lift pins positioned in the table and moving from the table to the height of over the guide pins; a plurality of proximity pins located on the table to hold the substrate when the lift pins are descended; a cylinder positioned under the table aid driving a plurality of movable arms in a transverse direction; and a plurality of alignment pins extended from the movable arms in a longitudinal direction.

13 Claims, 4 Drawing Sheets

ALIGNMENT APPARATUS OF THE SUBSTRATE FOR LCD

BACKGROUND OF THE INVENTION

1. Field of the invention

The present invention relates to an alignment apparatus for use in a process for manufacturing a liquid crystal display (LCD) device, and more particularly, for the substrate.

2. Description of Related Art

In general, a process for manufacturing a LCD device includes many steps (such as a cleaning process, a layer-depositing process and a developing process) to fabricate various elements on a substrate. After completion of the above-mentioned processes, a drying process is then performed. In preparation for drying, a robot arm moves the substrate from process to process until it is positioned into an alignment apparatus.

A conventional alignment apparatus employed in a drying process will be explained hereinafter as one example ,with reference to the accompanying drawings.

FIG. 1 is a plan view of a conventional alignment apparatus. A substrate 5 is positioned over a table 2 of the alignment apparatus. A plurality of guide pins 1 (eight pins in all) are located on the peripheral portion of the table 2 with a pair of guide pins 1 near each corner of the substrate 5.

FIGS. 2A and 2B are cross-sectional views taken along line—of FIG. 1. As shown in FIG. 2A, the substrate 5 is positioned on the lift pins 3 by a robot arm (not shown). Initially, the lift pins 3 extend above the table 2 for receiving the substrate 5. When the lift pins 3 descend with the supported substrate 5 to the table 2 of the alignment apparatus, as shown in FIG. 2B, the substrate 5 is aligned in a determined area defined by the guide pins 1. Proximity pins 4 hold the substrate 5 above the table 2 as the lift pins 3 continue to descend out of contact with the substrate 5. The proximity pins 4 have a portion that extends about 0.2 from the surface of the table 2. When the substrate 5 is in contact with and positioned on the proximity pins 4 after a descent of the lift pins 3, a hot-plate (not shown) having a high temperature dries the substrate 5.

However, as shown in FIG. 3, the substrate 5 can be misaligned as it descends towards the table 2 if it is not properly disposed within the predetermined space as defined by the guide pins 1.

The reason of the misalignment between the substrate 5 and the table 2 is not only that the dynamic error occurs when the robot arm carries the substrate 5 on the lift pins 3 but also that the lift pins 3 descend the substrate 5 without compensating for the dynamic error. If misaligned, the substrate 5 can be damaged or become stained as it contacts the guide pins 1.

SUMMARY OF THE INVENTION

In order to overcome the problems described above, a preferred embodiment of the present invention provides an alignment apparatus for use in a process of manufacturing an LCD device, which has plural alignment pins.

Another object of the present invention provides an alignment apparatus that prevents misalignment between a substrate and a table so as to avoid damage to the substrate.

In order to achieve the above objects, the preferred embodiment of the present invention provides an alignment apparatus, including: a table; guides positioned on a peripheral portion of the table; an acceptance device surrounded by the guide; a lift mechanism positioned on the table and moving between under the acceptance device and over the end portion of the guide; a transport for carrying a substrate on the lift when the lift projects over the end portion of the guide; a shifter for the lift into the acceptance device and for setting the substrate into the acceptance device; and a position-compensating mechanism for preventing the substrate from being positioned on the guide.

The position-compensating mechanism reciprocatingly moves a determined distance that is transverse and parallel to the table plane. The position-compensating mechanism further projects through and is perpendicular to the table. The position-compensating mechanism also moves from the peripheral portion to the edge of the acceptance device to align the substrate when the lift is positioned over the end portion of the guide.

It is to be understood that both the foregoing general description and the following detailed description are exemplary and explanatory and are intended to provide further explanation of the invention as claimed.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF PREFERRED EMBODIMENTS

Reference will now be made in detail to the preferred embodiment of the present invention, an example of which is illustrated in the accompanying drawings.

Figure 1:
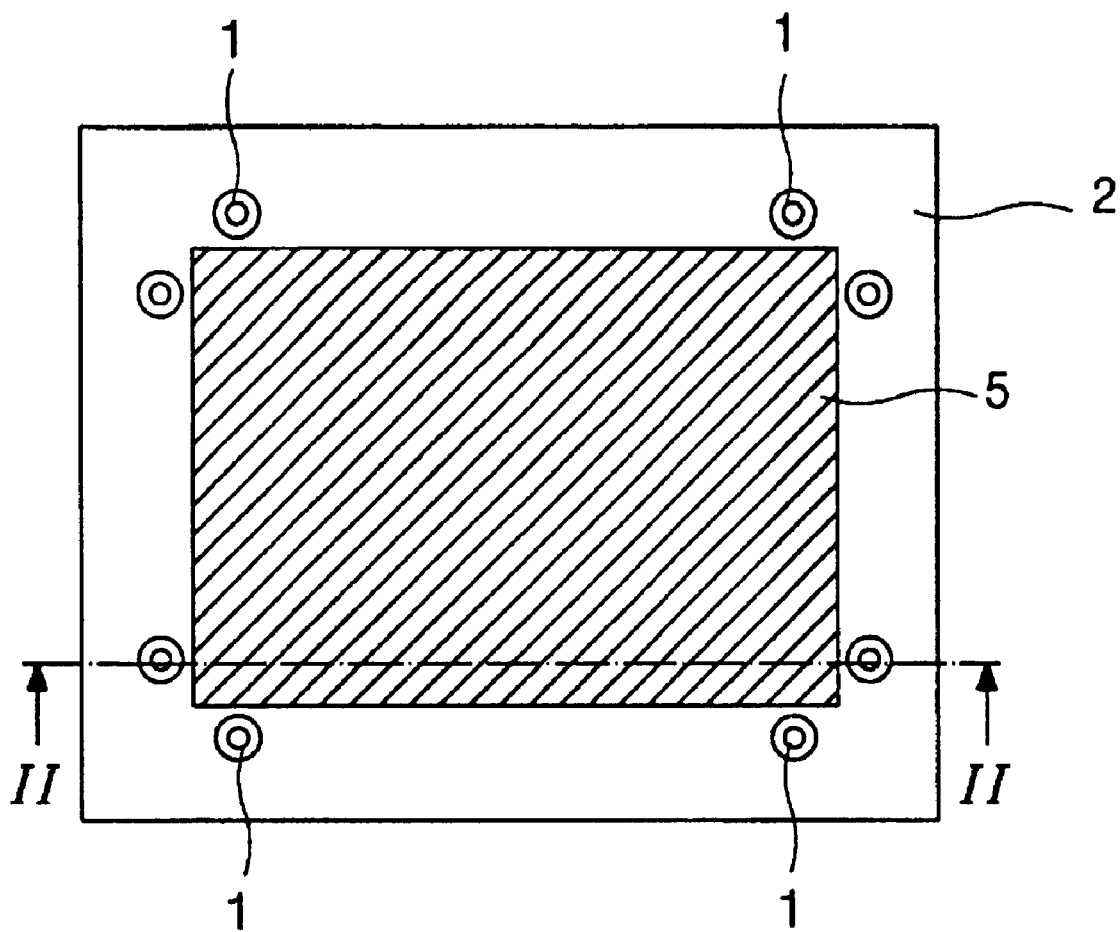
FIG. 1 is a plan view of a conventional alignment apparatus.
Figure 2A:
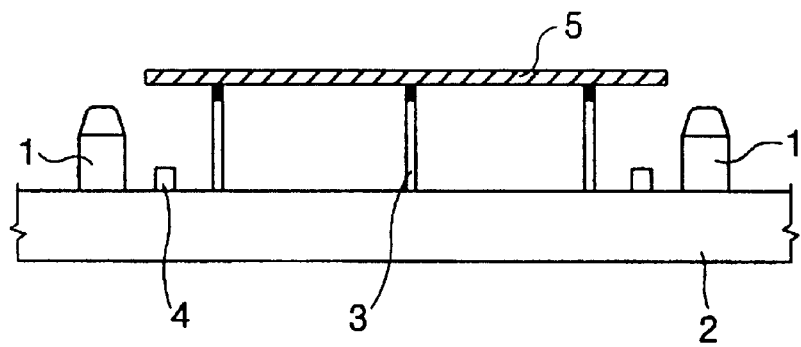
FIGS. 2A and 2B are cross-sectional views taken along line—of FIG. 1 and illustrate an alignment step.
Figure 2B:
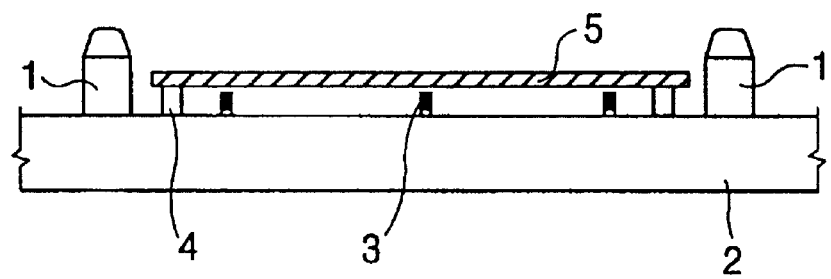
Figure 3:
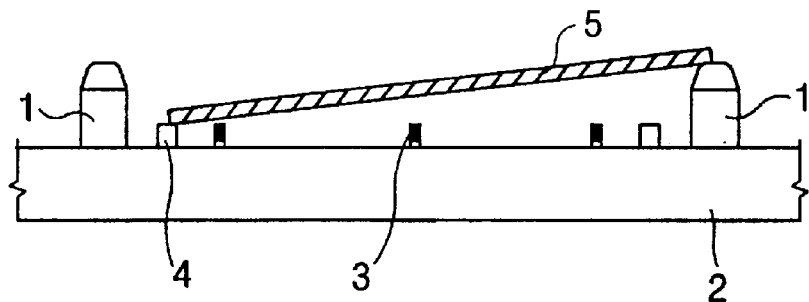
FIG. 3 is a cross-sectional view illustrating the misalignment of the substrate on the table according to the conventional art.
Figure 4:
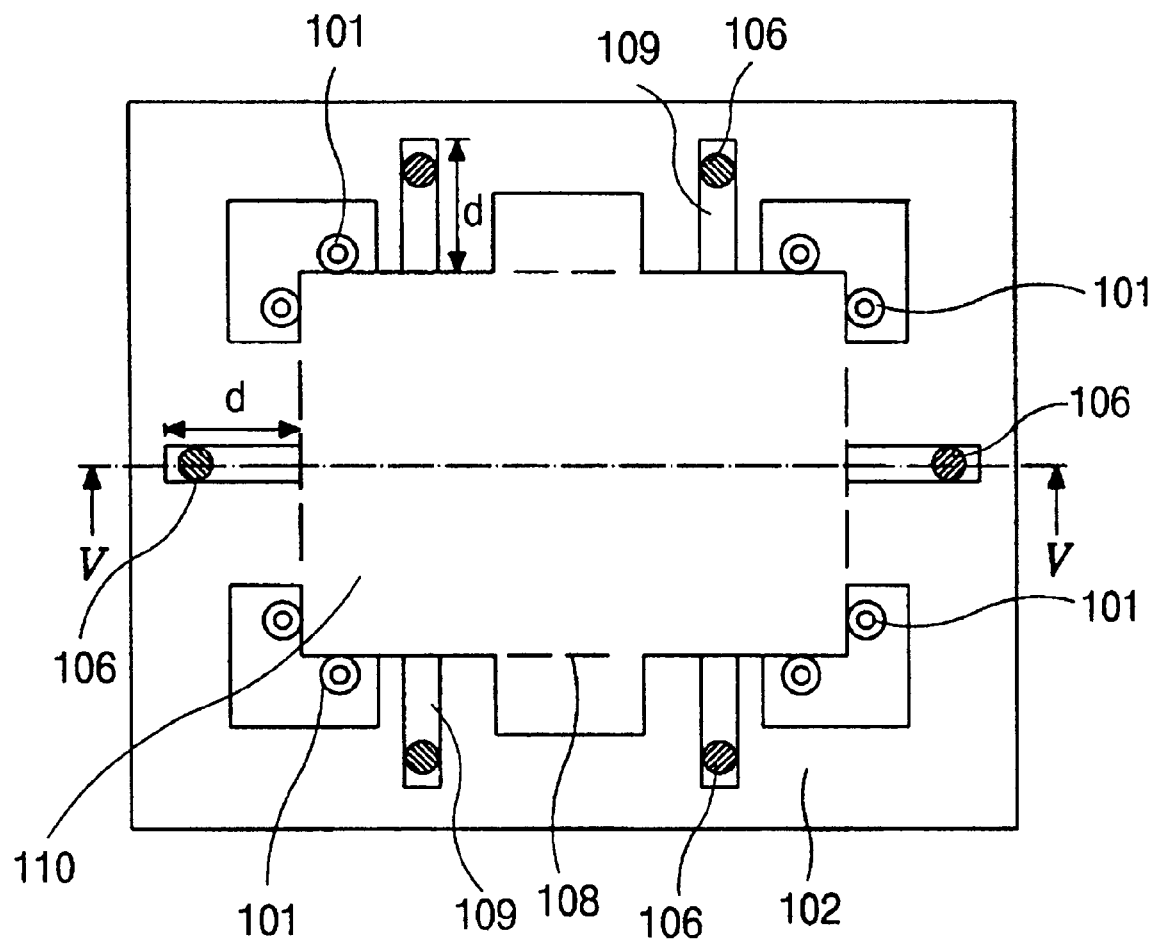
FIG. 4 is a plan view of an alignment apparatus according to an embodiment of the present invention.

FIG. 4 is a plan view of an alignment apparatus according to an embodiment of the present invention. A plurality of guide pins 101 are located on a table 102 of the alignment apparatus with a pair of guide pins 101 at each corner of a determined area 110. The determined area 110 is defined by the guide pins 101 as a central portion of the table 102 for receiving a substrate thereon. A plurality of the alignment pins 106 are located around the periphery of the table 102. The table 102 has a plurality of passages 109 in the peripheral portion thereof, through which the alignment pins 106 can move.

Figure 5:
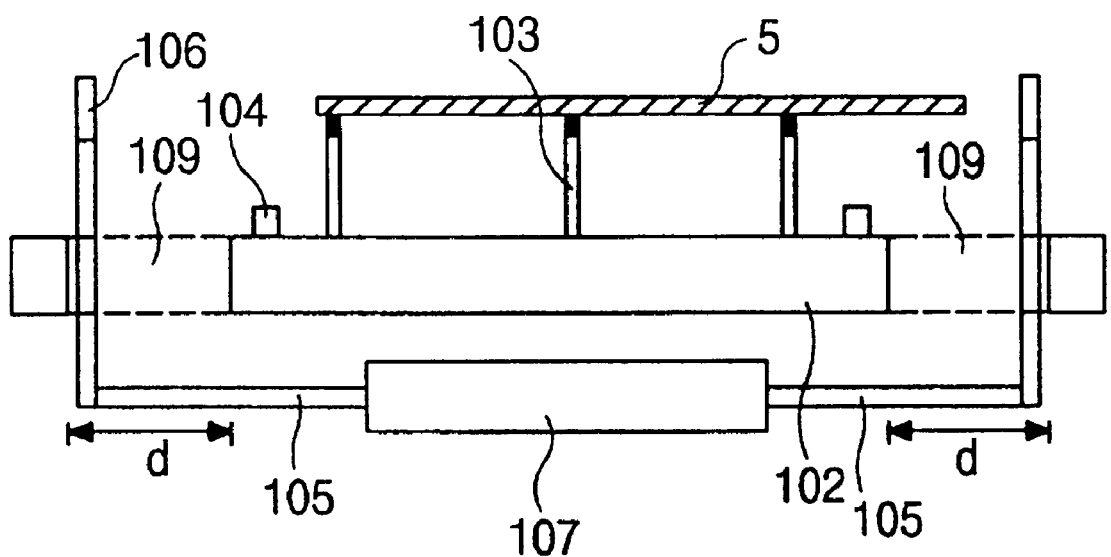
FIG. 5 is a cross-sectional view taken along line—of FIG. 4 and illustrates an operating state of the alignment apparatus according to the embodiment of the present invention.
Figure 6:
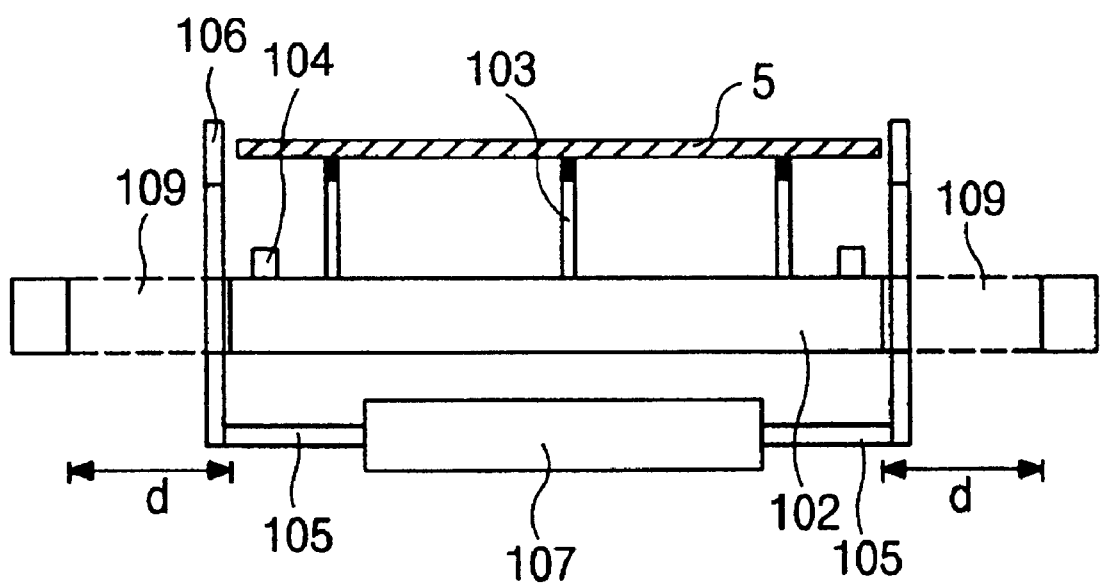
FIG. 6 is a cross-sectional view taken along line—of FIG. 4 and illustrates another operating state of the alignment apparatus according to the embodiment of the present invention.

As shown in FIGS. 5 and 6, proximity pins 104 for holding a substrate 5 above the table 102 are positioned on the table 2 for supporting the substrate 5. About 0.2 mm of the proximity pins 104 protrude from the surface of the table 102. The table 102 includes a hot-plate (not shown) having a high temperature for drying. A plurality of lift pins 103 are movably positioned in the table 102 for holding the substrate 5. The lift pins 103 reciprocally move between a lower position and a receiving position at which the height of the extended portion of the lift pins 103 is greater than the height of the guide pins 101 (see FIG. 4). A cylinder 107 is installed under the table 102 to drive a plurality of movable arms 105. The end portions of the alignment pins 106 are perpendicularly connected to the movable arms 105. Thus, the alignment pins 106 move in a transverse direction through the passages 109 when the cylinder 107 drives the movable arms 105.

The distance "d" represents the distance the alignment pins 106 can move within the passage 109, i.e., from the edge 108 of the determined area 110 (see FIG. 4) to the peripheral portion of the table 102. Hence, the reciprocation range of the alignment pins 106 can be defined by the distance "d".

The substrate 5 is positioned on the lift pins 103 by a robot arm 111 when the lift pins 103 are in a receiving position projected above the table 102 to a height greater than the height of the guide pins 101 (see FIG. 4). If the substrate 5 is misaligned, it can be adjusted into the determined area 110 (see FIG. 4) by the alignment pins 106 which are connected to the movable arms 105 and driven by the cylinder 107.

As described above, the substrate 5 is pushed onto the lift pins 103 by the alignment pins 106 when the lift pins 103 project into the receiving position. The substrate 5 is then placed on the proximity pins 104 by the descent of the lift pins 103. Thus, the alignment apparatus can set the substrate 5 in the determined area 110 defined by the guide pins 101. The substrate 5 is then dried using the drying process. After the drying process, the lift pins 103 lift extend and the substrate 5 from the proximity pins 104 and the robot arm (not shown) carries the substrate 5 to another process.

As described herein before, using the alignment pins of the alignment apparatus according to the preferred embodiment of the present invention, the damage of the substrate caused by the misalignment and the stain in the substrate can be prevented. Accordingly, the manufacturing yields increase.

While the invention has been particularly shown and described with reference to first preferred embodiment thereof, it will be understood by those skilled in the art that the foregoing and other changes in form and details may be made therein without departing from the spirit and scope of the invention.

What is claimed is:

1. An alignment apparatus, comprising:

a table;

guides on a peripheral portion of the table;

proximity devices surrounded by the guides;

lifters mounted on the table, for moving between a lower position which is lower than an upper part of the proximity devices and an upper position above the guides;

a transporter for placing a substrate on the lifters when the lifters are positioned at the upper position;

the lifters moving to the lower position so as to set the substrate onto the proximity devices; and positioning devices for positioning the substrate within the guides.

2. An apparatus according to claim 1, wherein the positioning devices move in transverse directions parallel to the table.

3. The apparatus according to claim 1, wherein the positioning devices move in a reciprocating motion.

4. The apparatus according to claim 1, wherein the positioning devices extend upwardly, perpendicular to the table.

5. The apparatus according to claim 1, wherein the positioning devices are driven by a cylinder.

6. The apparatus according to claim 5, wherein the cylinder is located under the table.

7. The apparatus according to claim 1, wherein the positioning devices move from a peripheral portion of the table toward the proximity devices while the lifter is at the upper position.

8. The apparatus according to claim 1, wherein the proximity devices include protruded portions on the table.

9. The apparatus according to claim 1, wherein the table is a table of the hot-plate type.

10. The apparatus according to claim 1, wherein the table includes a plurality of passages.

11. The apparatus according to claim 1, wherein the proximity device includes proximity pins for holding the substrate.

12. The apparatus according to claim 11, wherein the proximity devices are perpendicular to the table through the passage.

13. The apparatus according to claim 11, wherein the proximity pins maintain a gap between the table and the substrate.

* * * * *